United States Patent
Hosek

(10) Patent No.: US 9,837,294 B2
(45) Date of Patent: Dec. 5, 2017

(54) WAFER TRANSPORT SYSTEM

(71) Applicant: Persimmon Technologies Corporation, Wakefield, MA (US)

(72) Inventor: Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 1305 days.

(21) Appl. No.: 13/573,475

(22) Filed: Sep. 17, 2012

(65) Prior Publication Data

US 2013/0085002 A1    Apr. 4, 2013

Related U.S. Application Data

(60) Provisional application No. 61/627,065, filed on Sep. 16, 2011, provisional application No. 61/627,031, filed on Sep. 16, 2011.

(51) Int. Cl.
*H01L 21/677* (2006.01)
*F16D 3/00* (2006.01)

(52) U.S. Cl.
CPC .......... *H01L 21/67709* (2013.01); *F16D 3/00* (2013.01); *H01L 21/67706* (2013.01); *Y10T 464/30* (2015.01)

(58) Field of Classification Search
CPC ......... H01L 21/67706; H01L 21/67709; F16D 3/00; Y10T 464/30
USPC .......................................................... 414/217
See application file for complete search history.

(56) References Cited

U.S. PATENT DOCUMENTS

| | | | |
|---|---|---|---|
| 4,624,617 A | 11/1986 | Belna | |
| 4,805,761 A | 2/1989 | Totsch | |
| 5,377,816 A * | 1/1995 | Deligi | H01L 21/67709 198/619 |
| 5,417,537 A | 5/1995 | Miller | |
| 5,881,649 A * | 3/1999 | Hasegawa | H01L 21/67709 198/619 |
| 5,906,262 A * | 5/1999 | Miki | B65G 54/02 198/619 |
| 5,990,587 A | 11/1999 | Shimanovich et al. | |
| 6,183,615 B1 | 2/2001 | Yasar et al. | |
| 6,361,268 B1 | 3/2002 | Pelrine et al. | |
| 6,485,250 B2 | 11/2002 | Hofmeister | |
| 6,684,794 B2 | 2/2004 | Fiske et al. | |
| 6,712,907 B1 | 3/2004 | Pratt et al. | |
| 6,935,828 B2 * | 8/2005 | Ackeret | H01L 21/67742 198/619 |
| 6,954,041 B2 | 10/2005 | Korenaga | |

(Continued)

OTHER PUBLICATIONS

Line Emilie Fedders and Michael de Laine, "Magnet Screw Helps Capture Energy From Waves", http://sciencenordic.com/magnetic-screw-helps-capture-energy-waves, ScienceNordic, Jul. 6, 2012, four (4) pages.

*Primary Examiner* — James Keenan
(74) *Attorney, Agent, or Firm* — Iandiorio Teska & Coleman, LLP

(57) ABSTRACT

A transport system includes, in a first environment, a driving screw having threads with a thread pitch. In a second environment, a driven member has a magnetic coupling with a driven member pitch substantially corresponding to the thread pitch. The magnetic coupling is coupled to a portion of threads and rotation of the driving screw displaces the magnetic coupling with respect to the driving screw.

15 Claims, 15 Drawing Sheets

(56) References Cited

U.S. PATENT DOCUMENTS

| | | | |
|---|---|---|---|
| 7,438,175 B2 * | 10/2008 | White | C23C 14/56 118/719 |
| 7,597,186 B2 * | 10/2009 | Chung | G03G 15/6529 198/619 |
| 7,841,820 B2 | 11/2010 | Bonora et al. | |
| 7,901,539 B2 | 3/2011 | Bluck et al. | |
| 9,027,739 B2 * | 5/2015 | Hosek | F16D 3/00 198/619 |
| 2009/0162179 A1 | 6/2009 | Hosek et al. | |
| 2010/0230243 A1 * | 9/2010 | Kholodenko | H01L 21/67706 198/617 |

* cited by examiner

WAFER TRANSPORT SYSTEM

RELATED APPLICATIONS

This application claims benefit of and priority to U.S. Provisional Application Ser. Nos. 61/627,065 and 61/627,031 filed Sep. 16, 2011 under 35 U.S.C. §§119, 120, 363, 365, and 37 C.F.R. §1.55 and §1.78 and incorporated herein by this reference.

FIELD

The disclosed embodiment relates to wafer and other types of substrate processes.

BACKGROUND OF THE INVENTION

Wafers are typically handled in a vacuum environment to prevent contamination of the wafers and resulting electronic chips. Since motors and the like could result in contamination of the vacuum environment and the wafers, robot arms and structure used to handle wafers are designed so that all of the motors are outside the vacuum enclosure. See, e.g., U.S. Pat. No. 6,485,250 incorporated herein by this reference.

To transport wafers and other like substrates amongst different processing modules (e.g., load ports, load locks, transport chambers, processing modules, and the like), wafer carts are used. There have also been efforts to effect magnetic levitation in driving the wafer cart in a vacuum transport chamber.

In some designs, selectively energizeable electromagnets on one or more tracks outside the vacuum chamber interact with permanent magnets on a wafer cart inside the vacuum chamber to levitate and drive the wafer cart inside the vacuum chamber. See U.S. Pat. No. 4,624,617 incorporated herein by this reference. Controlling the wafer cart so it doesn't touch the vacuum chamber walls is difficult. See published U.S. Application No. 2009/0162179, incorporated herein by this reference. More advanced designs are highly complex, expensive, may be unreliable, and utilize a significant amount of energy. See U.S. Pat. Nos. 6,183,615 and 6,684,794 incorporated herein by this reference.

In other systems, a drive unit outside the vacuum has permanent magnets and so too does the wafer shuttle inside the vacuum chamber. See U.S. Pat. Nos. 7,841,820 and 4,805,761 incorporated herein by this reference. But, permanent magnet based systems necessarily results in a wafer shuttle which must contact the vacuum chamber walls. Contamination of the vacuum chamber and thus the wafers processed therein is thus possible through friction and wear of the contact surfaces.

SUMMARY

In one aspect, the wafer cart need not touch the vacuum chamber walls and yet the system is less complex and less expensive than prior systems. One unique aspect associated with one preferred embodiment features a vacuum chamber with a shape defining an interior rail for the wafer cart and an exterior tunnel for the shuttle. A portion of the wafer cart conforms to the vacuum chamber interior rail.

Featured is a transport system including in a first environment, a driving screw having threads with a thread pitch and, in a second environment, a driven member having a magnetic coupling with a pitch substantially corresponding to the thread pitch. The magnetic coupling is coupled to a portion of the threads so rotation of the driving screw displaces the magnetic coupling with respect to the driving screw. The driven member may comprise a nut surrounding at least a portion of the driving screw or a gear. The driven member may have a support bearing movably coupled to a sleeve disposed between the driving screw and the driven member.

A second driving screw may have second threads and a second magnetic coupling coupled to at least a portion of the second threads wherein rotation of the driving screw displaces the substrate support in a first direction and rotation of the second driving screw displaces the substrate support in a second direction.

In one embodiment, a second and third driving screw having second and third threads, respectively, may comprise a substrate support. A second and third magnetic coupling can be coupled to a portion of the second and third threads, respectively. Rotating the first driving screw displaces the substrate support in a first direction, rotation of the second driving screw displaces the substrate support in a second direction, and rotation of the third driving screw displaces the substrate support in a third direction.

Also featured is a substrate transport system comprising a non magnetic barrier sleeve isolating a first environment from a vacuum environment. A driving screw located within the first environment drives a member located within the vacuum environment and coupled to a substrate support. The driven member may be a magnetic coupling.

Also featured is a second driving screw having a second set of threads, and a second magnetic coupling magnetically coupled to at least a portion of the second threads. Rotation of the first driving screw displaces the substrate support in a first direction and rotation of the second driving screw displacing the substrate support in a second direction.

Also featured is a substrate transport system comprising first and second non magnetic barrier sleeves isolating a vacuum environment. A first and second driven screws have threads located within the first and second non magnetic barrier sleeves, respectively, outside of the vacuum environment.

A driven member is located within the vacuum environment one operably coupled to a substrate support. The driven member has a first magnetic coupling coupled to the first threads and a second driven member with a magnetic coupling to the second threads. Rotation of the first driving screw displaces the substrate support in a first direction and rotation of the second driving screw displaces the substrate support in a second direction.

The disclosed embodiments need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION

Figure 1:
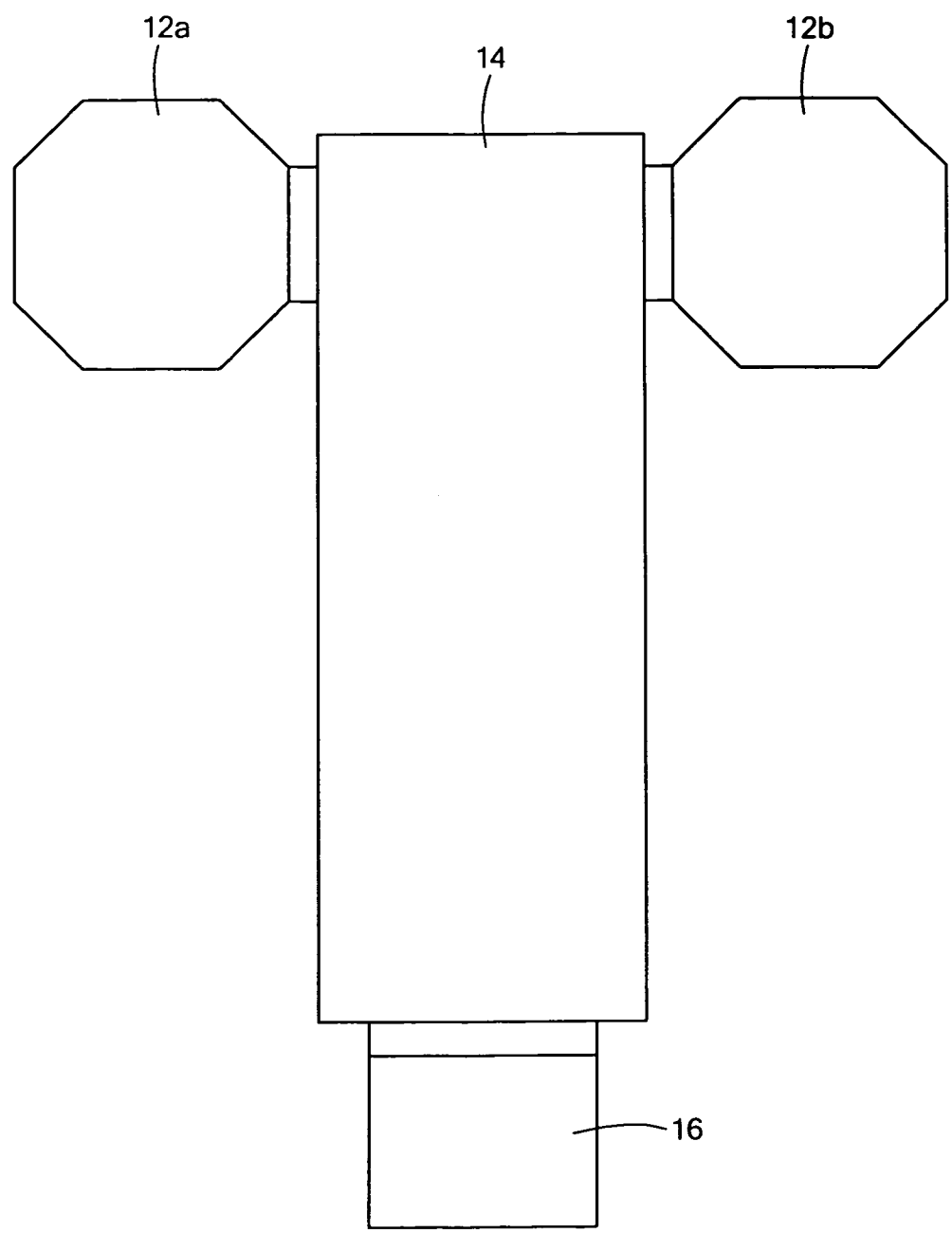
FIG. 1 is a schematic top view of a simplified example of a wafer processing system including various modules.

The disclosed embodiment is capable of other embodiments and of being practiced or being carried out in various ways. Thus, it is to be understood that the disclosed embodiment is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

FIG. 1 depicts an example of wafer processing modules 12a and 12b, transport module 14, and load station 16, all of which typically constitute interconnected vacuum chambers. In this simplified example, processing chambers 12a and 12b may include robot arms. There may be many more modules and stations in a complete system.

Figure 2:
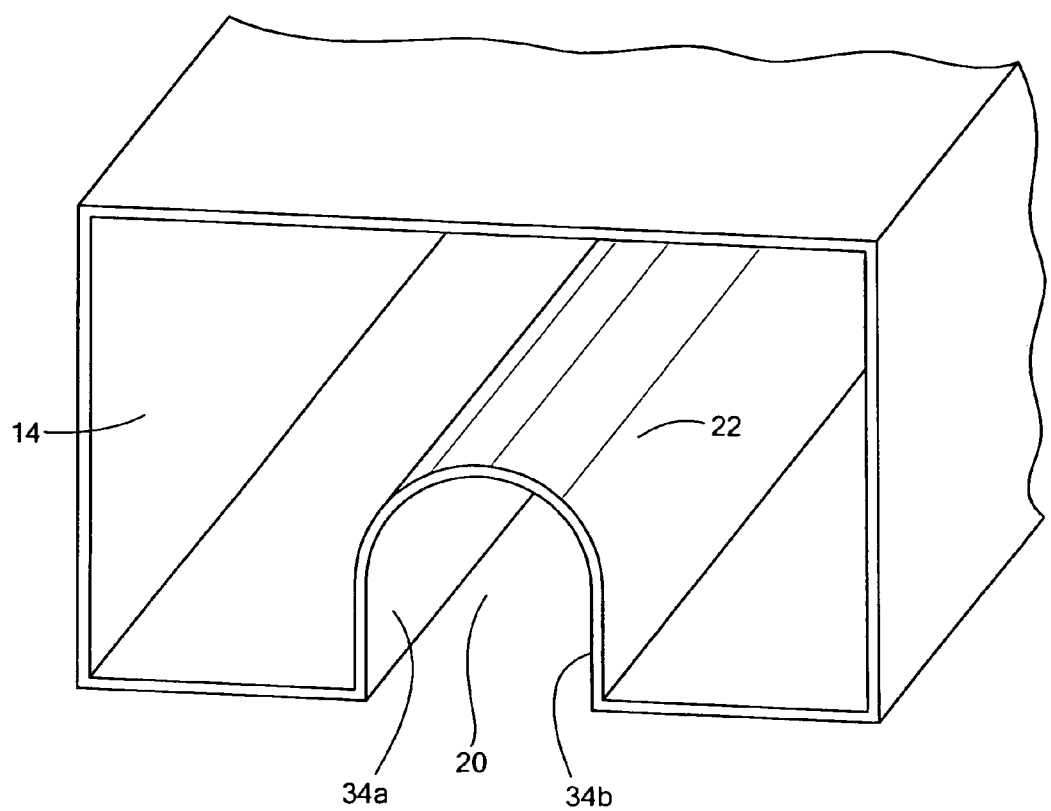
FIG. 2 is a schematic view showing the rail and tunnel portion of the vacuum chamber transport module depicted in FIG. 1.
Figure 3:
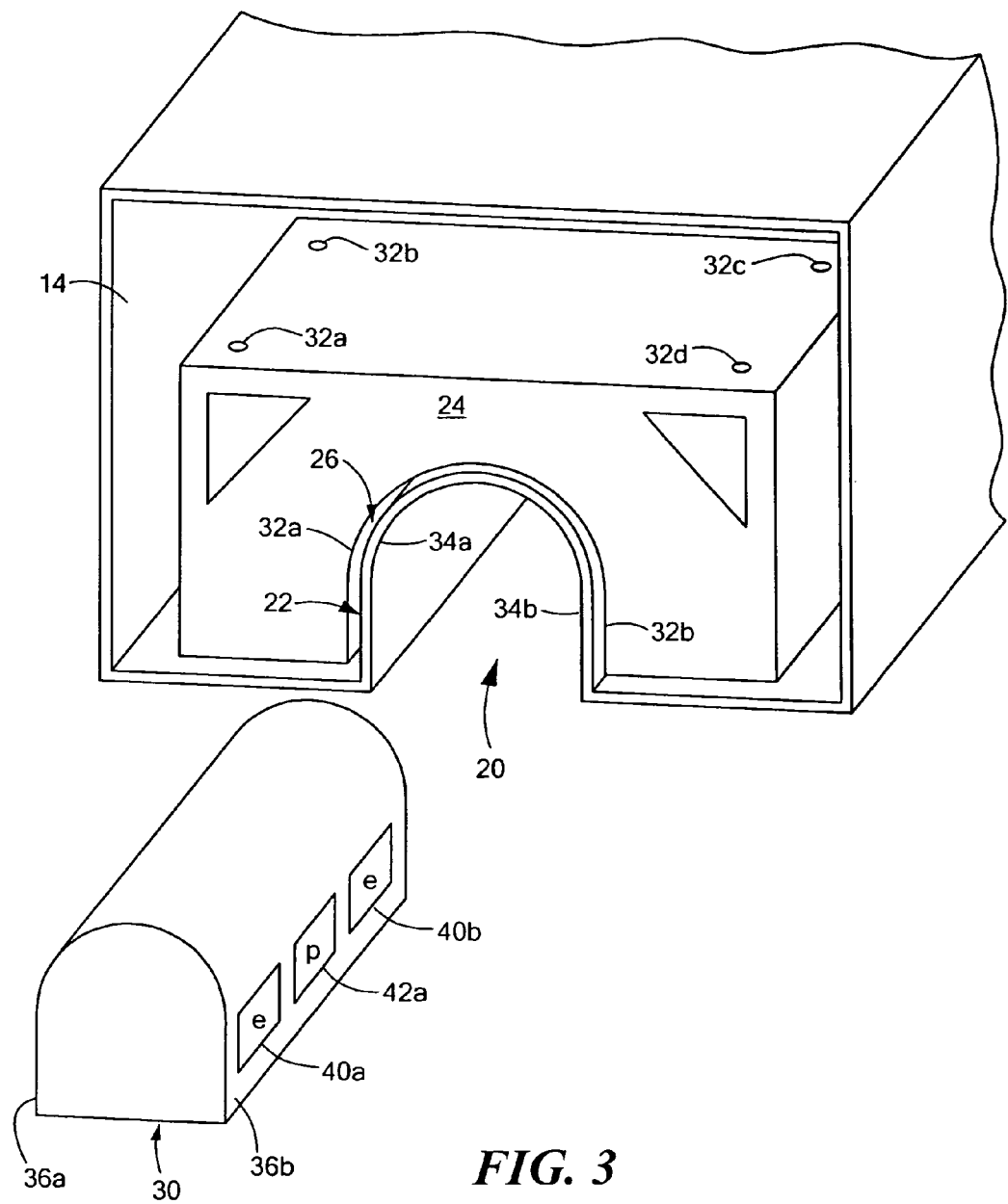
FIG. 3 is a schematic three dimensional view showing now the wafer cart inside the vacuum chamber about its rail and a linearly driven shuttle maneuverable in the tunnel defined by the vacuum chamber.

FIG. 2 shows one particular vacuum chamber 14 defining exterior tunnel 20 forming interior rail 22. Wafer cart 24, FIG. 3 is disposed inside vacuum chamber 14 and is configured with shoe 26 shaped about vacuum chamber rail 22. In this specific example, rail 22 is a curved convex structure and shoe 26 is a curved concave structure. Shuttle 30 levitates cart 24 into a non-contact spaced relationship with respect to interior wall 22 of chamber 14 and linearly drives shuttle 24 within chamber 14.

Shuttle 30 is preferably linearly driven and resides outside vacuum chamber 14 and travels to and fro in tunnel 20. Shuttle 30 and wafer cart 24 are configured such that wafer cart 24 is levitate by shuttle 30 (shoe 26 is spaced from rail 22) and follows shuttle 30 as it travels in tunnel 20.

In this way, a wafer or other like substrate on supports 32a-32d on the top surface of wafer cart 24 can be transported, for example, from load lock 16, FIG. 1 to station 12b via vacuum chamber 14. In other examples, wafer cart 24 is equipped with one or more movable maneuvering wafer arms. See, for example, U.S. Pat. No. 7,901,539 incorporated herein by this reference.

Figure 4:
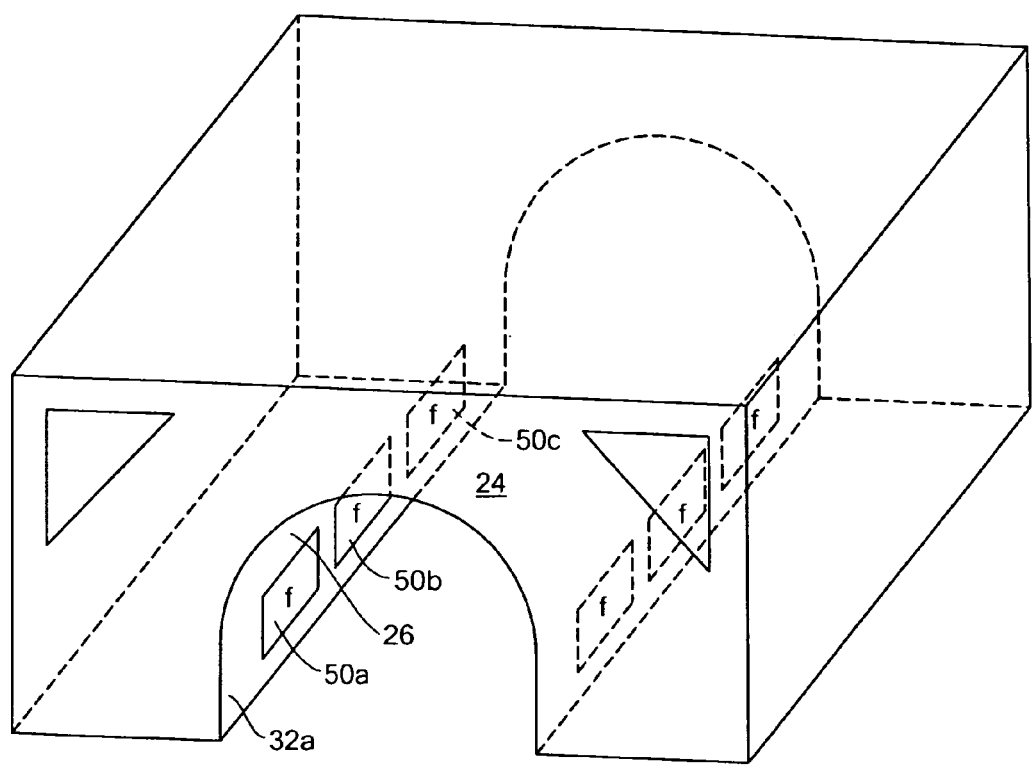
FIG. 4 is a schematic three dimensional front view of the wafer cart shown in FIG. 3.

In one preferred design as shown in FIGS. 3-4, the wafer cart shoe walls 32a, 32b; the tunnel walls 34a, 34b; and optionally the shuttle walls 36a, 36b are configured in a concentric design as shown so, for example, shuttle wall 36a is fairly close to and shaped the same as wafer cart wall 32a and yet separated therefrom by vacuum chamber barrier wall 34a.

Now, with electromagnetic and permanent magnets in the shuttle walls and ferromagnetic material in the wafer cart walls, the wafer cart can be elevated within the vacuum chamber slightly above rail 22 and driven to and fro in vacuum chamber 14, and also controlled so that the shuttle does not touch the vacuum chamber.

For example, here shuttle wall 36 is made of non-magnetic material such as stainless steel. Set in shuttle wall 36b are fore and aft electromagnets 40a and 40b and permanent magnet 42a. Shuttle wall 36a is configured similarly. Non-magnetic wafer cart wall 32a has spaced ferromagnetic (e.g., iron) members 50a, 50b, 50c as does wall 32b.

Shuttle permanent magnets 42a and wafer cart ferromagnetic member 50b are configured to levitate the wafer cart off the vacuum chamber rail and to urge the wafer cart to follow the shuttle.

To control the orientation of the wafer cart, the electromagnets are used in conjunction with the ferromagnetic elements in the wafer cart walls. For example, if the left hand side of the wafer cart (e.g., wall 32a) starts to get too close to rail 22 (and wall 34a) as determined by position sensors, then both electromagnets 40a and 40b are energized, pulling wall 32b of the wafer cart closer to vacuum chamber wall 34b and driving wafer cart wall 32a away from vacuum chamber wall 22 and also centering the wafer cart in a spaced relationship with respect to the vacuum chamber rail. Energizing only one shuttle electromagnet (or alternate side, different position electromagnets) would change the yaw angle of the wafer cart.

In this way, with only four electromagnets and two permanent magnets, the wafer cart yaw, pitch, and roll can be controlled. For example, if the wafer cart is pitched down in the front, rear shuttle electromagnets 40a can be energized. If the wafer cart rolls to the right, left hand side electromagnets can be energized to correct the roll.

Figure 5:
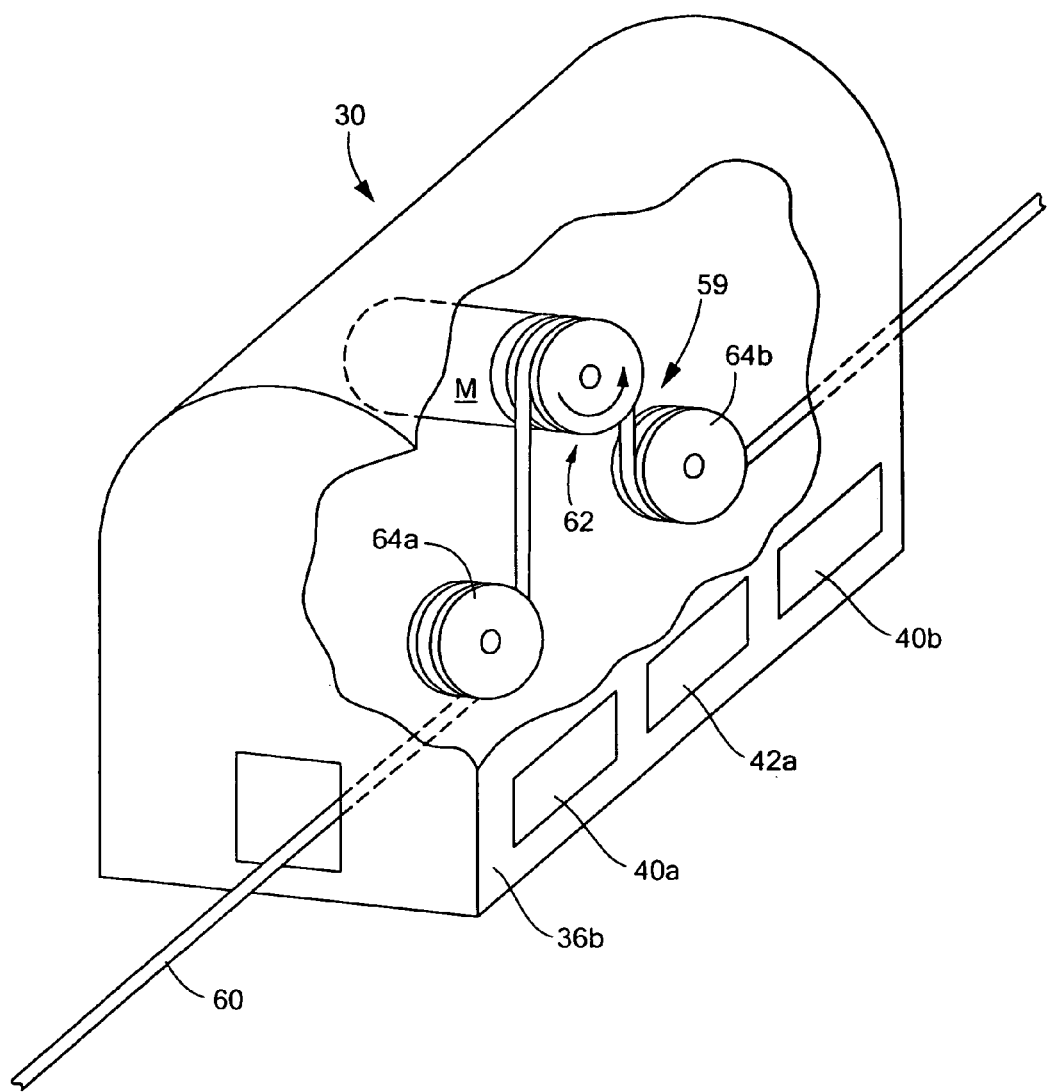
FIG. 5 is a schematic three dimensional partially cut away view of an example of a linearly driven shuttle as depicted in FIG. 3.

And, the wafer cart is designed to remain sterile. Shuttle 30, FIG. 5 contains the linear drive mechanism(s), the position sensors, the driven magnetic coils, the power supply, the controlling electronics and the like but shuttle 30 is outside of the vacuum chamber. One exemplary drive mechanism 59 includes belt 60 fixed on one or both ends and driven by motor drive 62 between free spinning pulleys 64a and 64b. Other drive mechanisms are possible.

Another drive mechanism for shuttle 30 is a lead or ball screw arrangement for a magnetic screw. See, for example, U.S. Pat. No. 6,712,907 incorporated herein by this reference.

Figure 6:
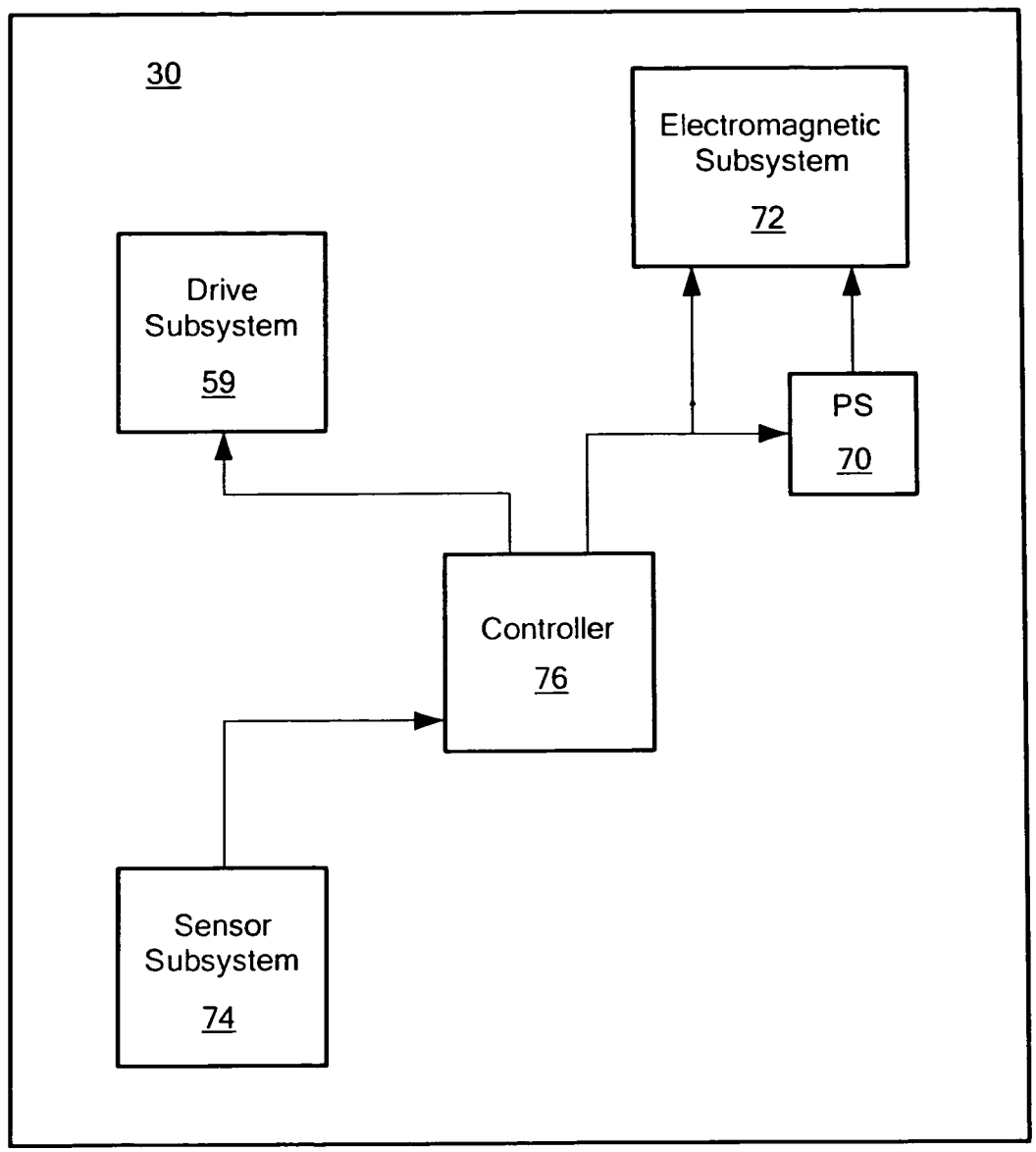
FIG. 6 is a block diagram showing the primary components associated with the linearly driven shuttle as depicted in FIG. 5.

Shuttle 30, FIG. 6 includes a drive subsystem 59 as just disclosed, power supply 70, an electromagnetic subsystem 72, a sensor subsystem 74, and controller 76. Controller 76

(e.g., a microcontroller, application specific integrated circuit, or the like), based on the output of sensor subsystem 74, controls both drive subsystem 59 and, as discussed above, the electromagnetic subsystem 72 to control the orientation of the wafer cart with respect to the vacuum chamber rail. Control and positioning of the vacuum wafer cart based on position sensors and electromagnets is noted in published U.S. Application No. 2009/0162179, incorporated herein by this reference.

Figure 7:
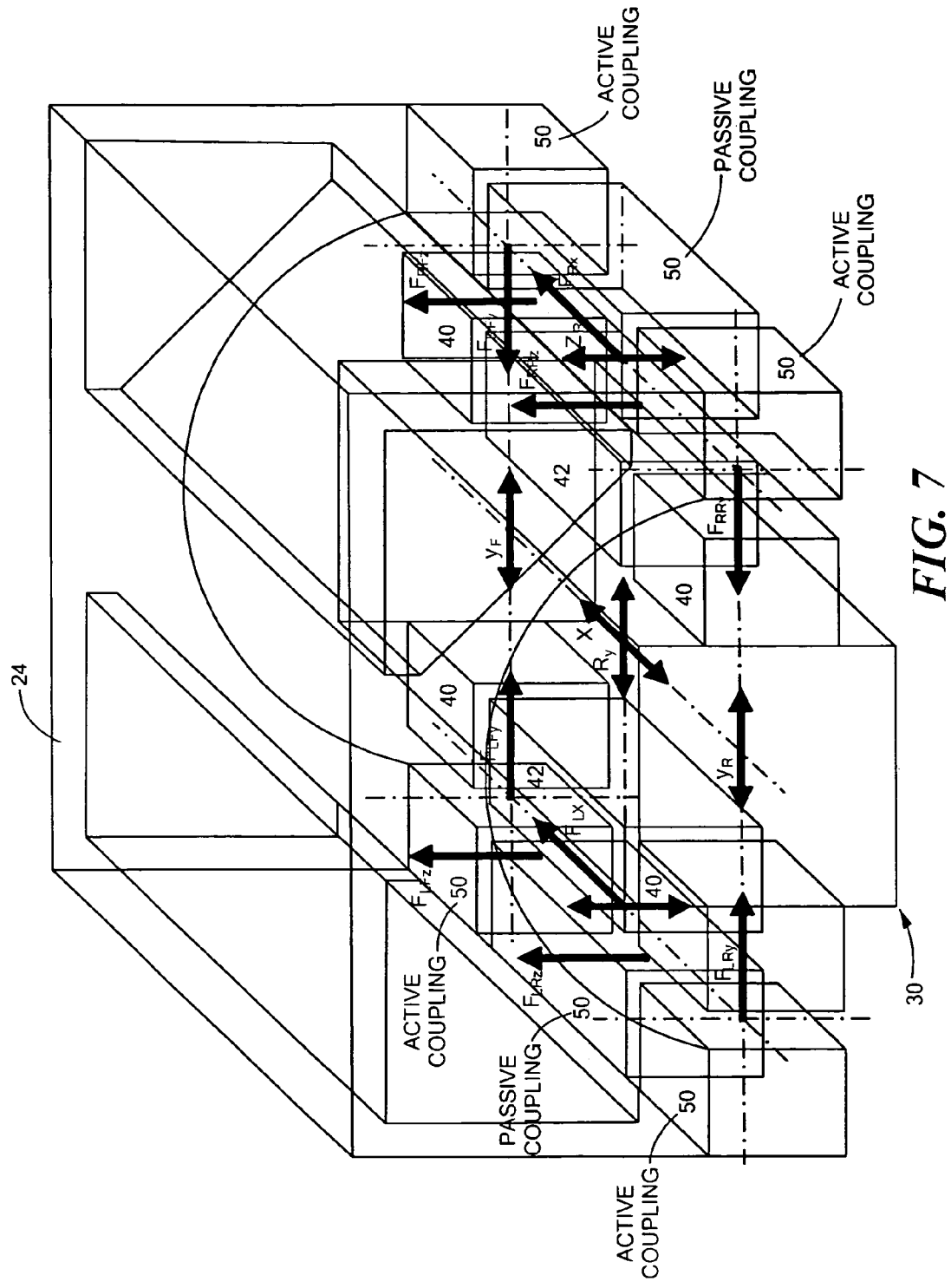
FIG. 7 is a highly pictorial view of the wafer cart and the shuttle depicted in FIGS. 4 and 5 showing the passive and active magnetic coupling techniques used in one preferred embodiment of the invention.

FIG. 7 shows again wafer cart 24 and shuttle 30 and the respective permanent magnets (42), electromagnets (40) and ferromagnetic members (50). The interaction between the shuttle electromagnetics and the wafer cart ferromagnetic members is active coupling while the interaction between the shuttle permanent magnets and the wafer cart ferromagnetic members is passive coupling as depicted in the figure. The vectors shown show how active control $F_{LFy}$ and $F_{RFy}$ control $y_F$ and $F_{LFy}$ and $F_{RRy}$ control $y_R$ for guidance and yaw control. Passive coupling means $F_{Lx}$ and $F_{Rx}$ control x for propulsion and $R_{LFz}$, $F_{RFz}$, $F_{LRz}$, and $F_{RRz}$ control z and Ry for lift, pitch, and roll control.

Figure 8:
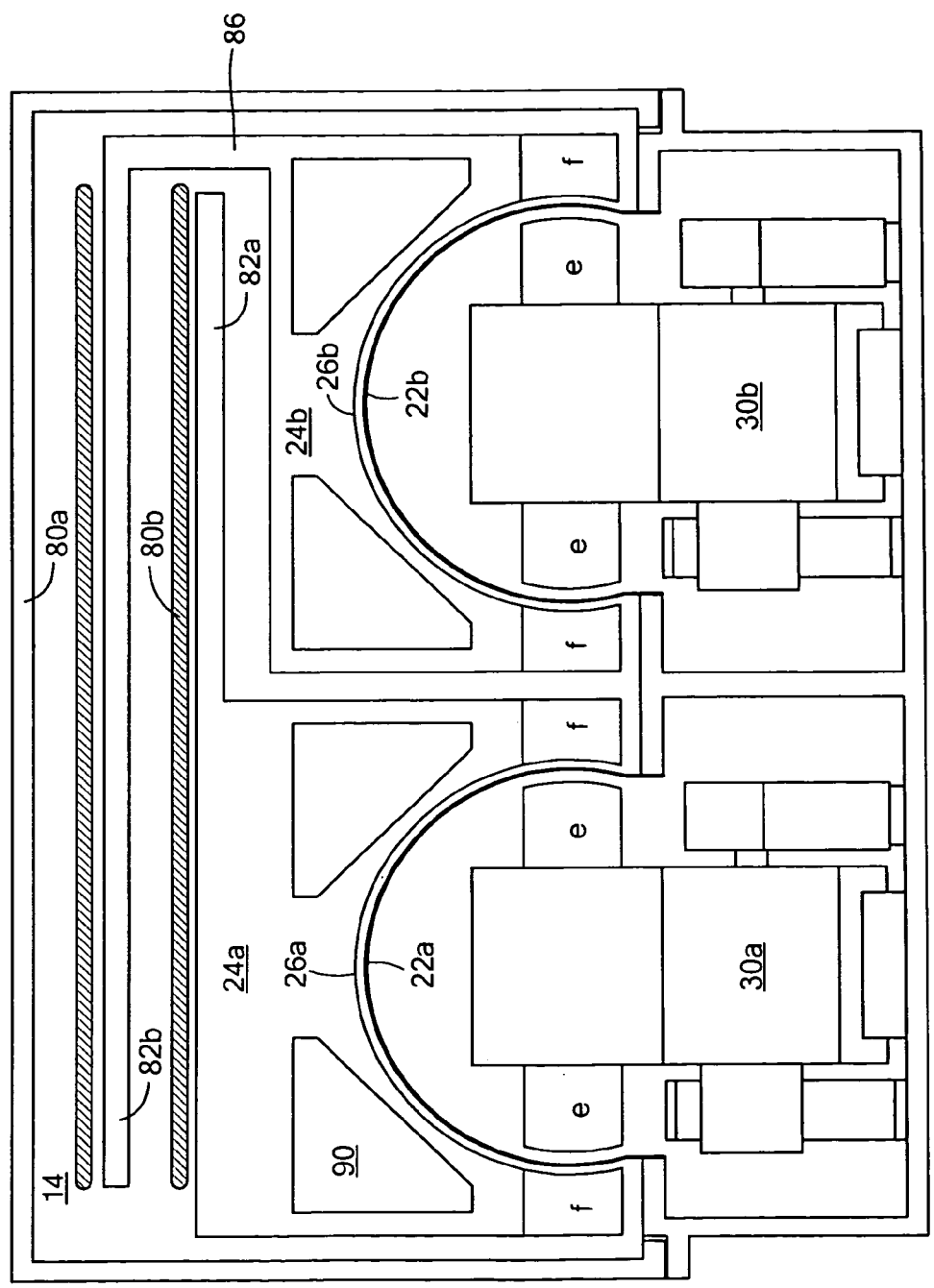
FIG. 8 is a schematic cross sectional depiction of another vacuum chamber featuring two wafer carts and two shuttles.

FIG. 8 shows a dual shuttle configuration where vacuum chamber 14 includes two independently driven substrate carts 24a and 24b each with conforming shoes 26a and 26b. Vacuum chamber 14 defines dual rails 22a and 22b and two independently driven shuttles 30a and 30b are shown. Wafer cart 24a supports substrate 80b on top surface 82a a portion of which extends over wafer cart 24b as shown. Wafer cart 24b supports wafer 80b on top surface 82b which extends horizontally from vertically disposed arm 86. Cutouts such as cutout 90 is for weight savings and/or balance control.

The result is one or more wafer carts that do not touch the vacuum chamber walls and yet the system is less complex and less expensive than prior systems. In one aspect, irrespective of the specific shape or shapes or configurations, the preferred vacuum chamber forms an interior rail of a sort with a tunnel in it for travel of the exterior shuttle. The wafer cart inside the vacuum chamber has a shoe portion shaped conformably about the vacuum chamber rail. A magnet subsystem is associated with at least the shuttle and is configured to levitate the wafer cart conformal shoe into a spaced relationship with respect to the vacuum chamber interior rail, to adjust the orientation of the wafer cart with respect to the rail, and to drive the wafer cart in the vacuum chamber with the shuttle outside the vacuum chamber in the tunnel.

Figure 9A:
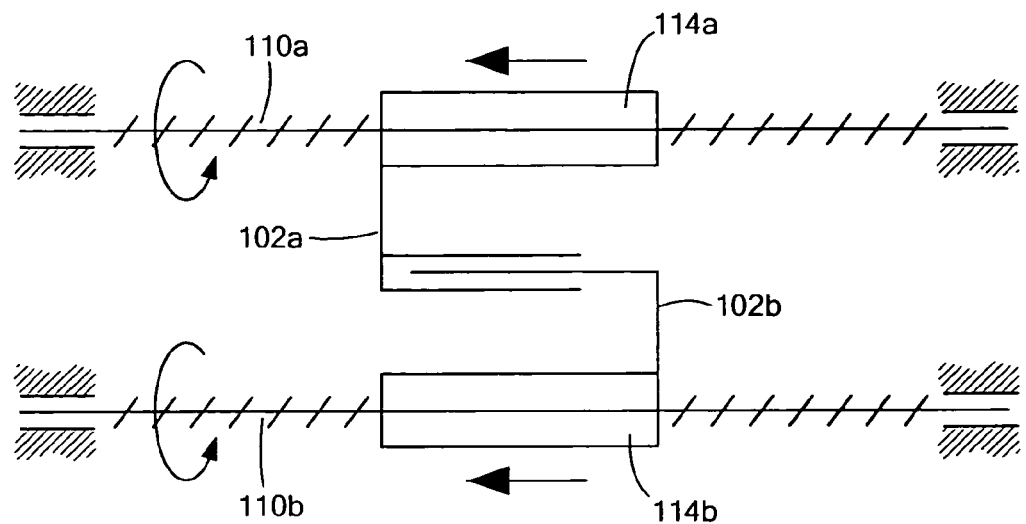
FIGS. 9A and 9B are schematic top views showing another example of a wafer transport system in accordance with the invention.
Figure 9B:
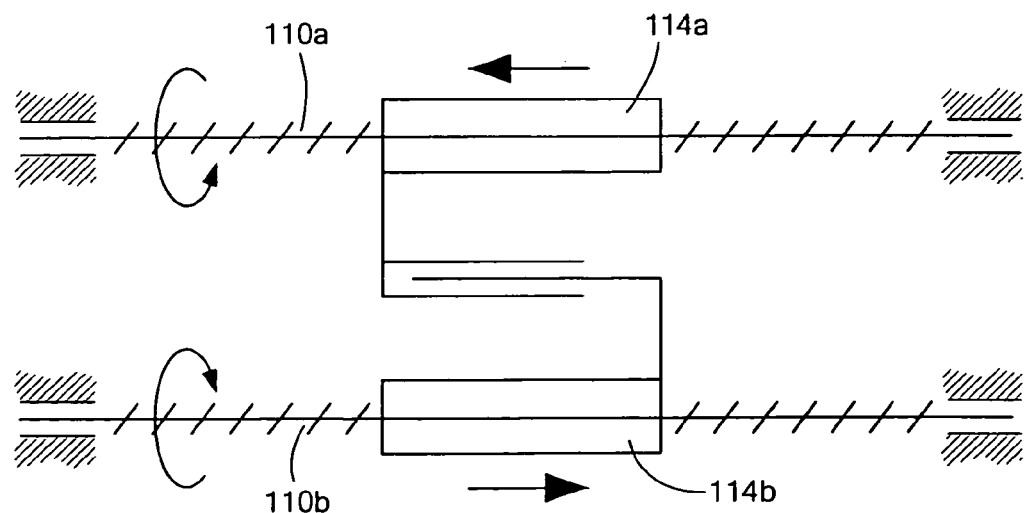

In other designs, the shuttle in the tunnel is or includes one or more magnetic ball screws. FIGS. 9A and 9B show a design with two magnetic ball screws 110a and 110b outside the vacuum environment and magnetic arrays configured as nuts 114a and 114b within the vacuum environment magnetically linearly driven by screws 110a and 110b, respectively. See also FIG. 10. The nuts support frame members 102a and 102b. In FIG. 9A, driving both screws in the same direction linearly drives frame members 102a and 102b within the vacuum chamber. Driving the screws in the opposite direction can cause an arm on the frame members to rotate, or the like.

The contactless lead screw mechanism(s) may be utilized to convert rotary motion to linear motion, and vice versa without the negative aspects of mechanical contact, such as the presence of friction, the need for lubrication, generation of particles and sensitivity to aggressive environments associated with conventional lead screws and ball screws. Therefore, due to its cleanliness of operation, the contactless lead screw mechanism may be suitable for clean and vacuum applications and, due to its resistance to aggressive agents, for harsh environments where conventional solutions fail. The present contactless lead screw mechanism of one or more embodiments of this invention may be utilized in a material transport system, e.g., to produce linear motion of a material transport platform.

Figure 10:
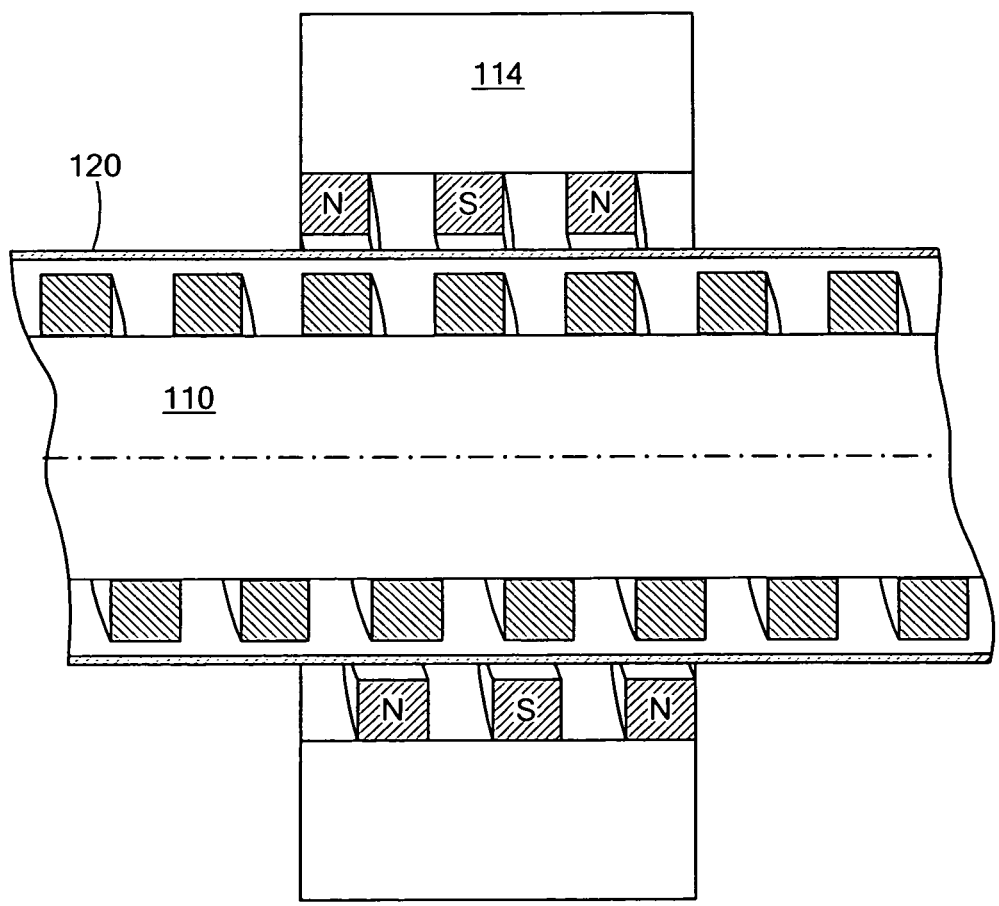
FIG. 10 is a schematic cross sectional view of a magnetic ball screw and magnetic array configured as a nut associated with the system of FIG. 9.

As shown in FIG. 10, the contactless lead screw mechanism may include a lead screw component 110 with threads having a thread pitch and one or more nut components 114 with threads having substantially the same thread pitch as the pitch of the screw. The lead screw component may include a body of a substantially cylindrical shape and thread-type features on the cylindrical body made of a ferromagnetic material. The thread-type features may be made of a solid piece, assembled from multiple pieces, laminated from multiple sheets to reduce eddy current losses, formed from powder metal or produced in any other suitable manner. The lead screw component may be constrained so that it is allowed to rotate with respect to the axis of its cylindrical body or tunnel, e.g., by utilizing one or more rotary bearings, with respect to the nut component(s). Each nut component 114 may include a body, made of one or more parts, with a substantially hollow cylindrical cavity, which may feature a thread-type arrangement made of a ferromagnetic material and compatible with the thread-type features on the lead screw component. The thread-type arrangement may be made of a solid piece, assembled from multiple pieces, laminated from multiple sheets to reduce eddy current losses, or produced in any other suitable manner. Each nut may also feature one or more magnets located so that a magnetic circuit is closed through the thread-type arrangement of the nut component and the thread-type features of the lead screw component. The magnets may be permanent magnets, electrically activated magnets or any magnets of any suitable type.

In an alternative embodiment, the magnet(s) of the nut component may interact directly with the thread-type features of the lead screw component. In yet another embodiment, the magnet(s) may be incorporated into the lead screw component. Each nut component may be constrained so that it is allowed to translate along the axis of the cylindrical body of the lead screw component, e.g., by utilizing one or more linear bearings, with respect to the lead screw component. A separation vacuum chamber wall made of a non-ferromagnetic material, which may, for example, be of a cylindrical shape, may be present between the ball screw component and the nut component(s).

When the lead screw component is caused to rotate, the magnetic field produced by the magnets results in magnetic forces between the thread-type features of the lead screw component and the thread-type arrangement of the nut component(s). This causes the nut component(s) to move linearly along the axis of the cylindrical body of the lead screw component. The separation wall between the lead screw component and the nut component(s) may be utilized to separate the environment where the lead screw component is located from the environment of the nut component(s). For example, the lead screw component may be located in atmosphere and the nut component(s) may be located in vacuum.

Numerous industrial applications, including transportation and positioning systems, require a platform that can move along a straight-line path while carrying an actively driven mechanism, such as a robotic arm. The moveable platform according to one or more embodiments of this present invention may provide this functionality with no on-board active components, such as power management solutions, control electronics and actuation arrangements.

As a result, the moveable platform of this invention may be suitable for applications where the presence of active components on the moveable platform is undesirable, for instance, due to issues with heat removal, such as in vacuum environments.

As shown in FIG. 9, the moveable platform according to the one embodiment of this invention may include a body, which may be constrained to move along a straight-line path, for example, by utilizing one or more linear bearings or a magnetic levitation system. One or more magnetic nut components may be rigidly or moveably coupled to the body. One or more lead screw components may be arranged along the direction of motion of the body, for example, on the side of the body, below the body, above the body or in any suitable manner, so that the axes of rotation of the worm components are substantially parallel with the direction of motion of the body. Each of the lead screw components may interact with one or more nut components through magnetic forces, forming one or more contactless lead screw mechanisms. Separation walls made of a non-ferromagnetic material may be present between the nut component(s) and the lead screw component(s).

An example of the moveable platform of one or more embodiments of this invention may include a body with a first nut component attached rigidly to the body and a second nut component coupled moveably to the body, e.g., through a linear bearing. A first lead screw component may be utilized to interact with the first nut component, and a second lead screw component may be utilized to interact with the second nut component. When the first and second lead screw components rotate in the same direction, the first nut causes the body of the platform to move and the second nut moves with the body in the same manner as the body. If the first lead screw component is kept stationary and the second lead screw component rotates, the first nut component and, therefore, the body remain stationary while the second nut component moves relative to the body. Any combination of translation of the body and relative motion of the second nut component with respect to the body may be achieved by properly coordinated rotation of the two lead screw components. In this way, a substrate cart body can be driven linearly and an arm on the substrate cart body can be rotated.

The arrangement discussed above may be utilized to realize a moveable platform that may carry a robotic arm driven by the relative motion of the second nut component with respect to the body. When the lead screw components rotate in the same direction, the entire platform translates with no motion of the robotic arm with respect to the body of the platform. By rotating the second lead screw component while the first lead screw component is kept stationary, the robotic arm may be operated while the body of the platform remains stationary. The arm may be operated simultaneously while the body of the platform moves by properly coordinated rotation of the two lead screw components. Separation walls between the nut components and the lead screw components may be utilized to separate the environment(s) where the body and robotic arm operate and where the lead screw components are located. For example, since the body and robotic arm are completely passive, they may be located in a vacuum environment while the lead screw components may conveniently stay in atmosphere. Additional degrees of freedom of the robotic arm may be realized by employing additional nut and lead screw components.

Figure 11:
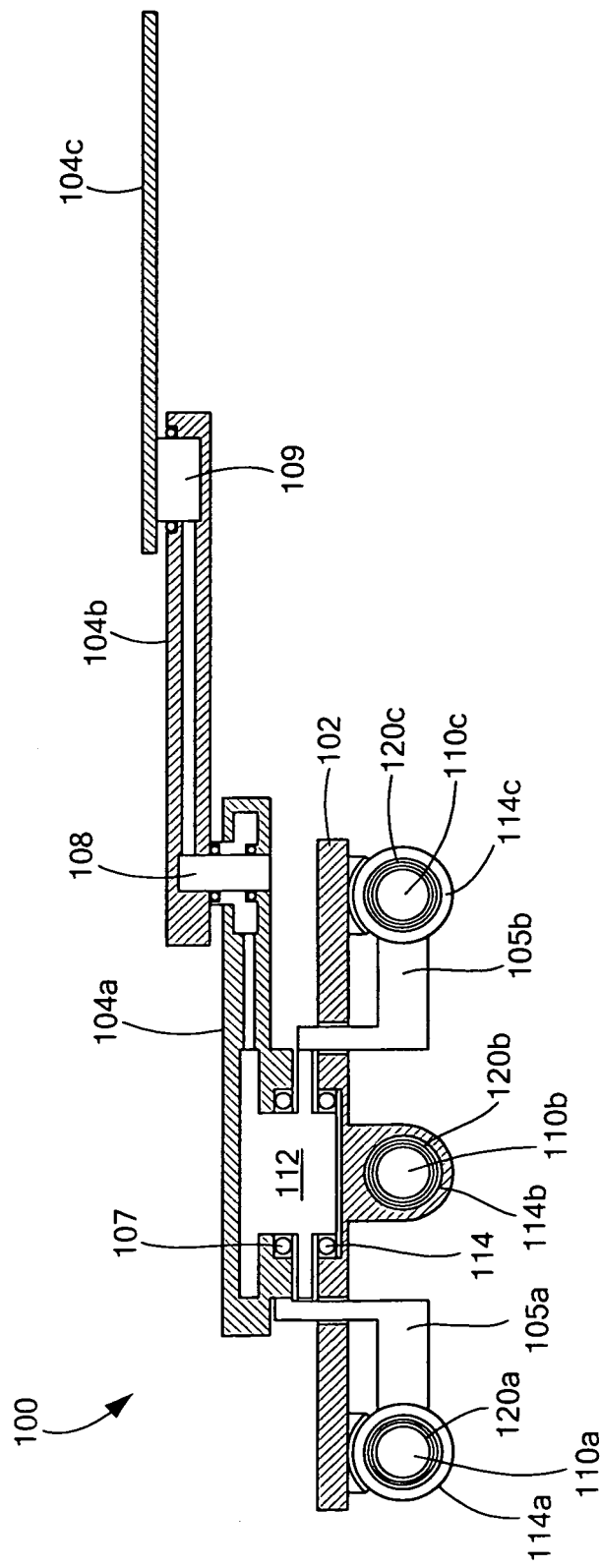
FIG. 11 is a schematic cross sectional front view of an example of a substrate transport platform in accordance with one embodiment.

FIG. 11 shows a substrate cart platform 100 with frame 102. Arm 104a is rotatable with respect frame 102 via linear drive 105a and bearing 107. Arm 104b is rotatable with respect to arm 104a via pulley 108. Arm 104c is rotatable with respect arm 104b via pulley 109. The cart platform is linearly driven. Thus, here, three degrees of freedom are possible.

Here, there are three ball screw shafts 110a, 110b, and 110c each independently driven by a servomotor and belt/pulley set or the like. Each ball screw resides in a tunnel in the vacuum chamber and is thus isolated from the wafer environment.

Rotating ball screw 110a linearly actuates drive 105a and rotates arm 104b extending and retracting arms 104b and 104c. Rotating all three ball screws 110a, 110b, and 110c linearly moves frames 102 and its arms. Rotating ball screws 110a and 110b rotates arm 104a.

Linear drive 105b is linearly activated by rotating ball screw 110c and linearly actuating drive 105b rotates pulley 112 which rotates arm 104b. Pulley 112 is rotatable with respect to frame 102 via bearing 114. Linear drives 105a and 105b may drive their respective arms 104a and pulley 112 via rack and pinion interfaces, for example.

The linear drives include nuts 114 magnetically driven by their respective ball screw shafts. The nuts may include magnetic arrays as shown in and/or as discussed above with respect to FIG. 10 and/or as shown in U.S. Pat. No. 6,712,907 incorporated herein by this reference. Such nuts are within the vacuum environment.

Figure 12A:
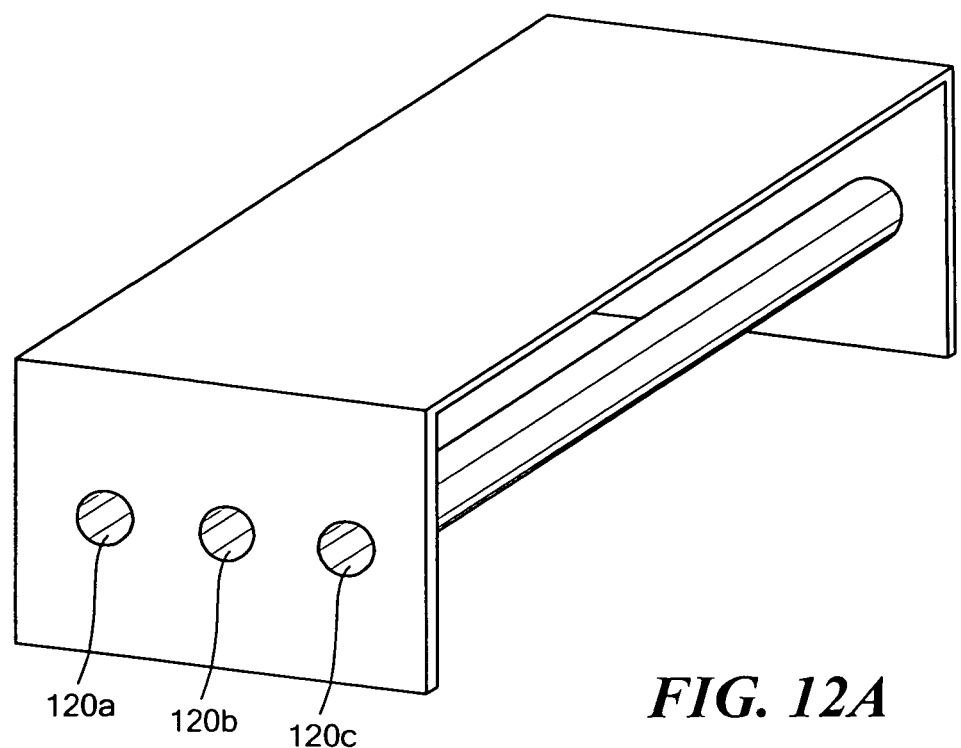
FIGS. 12A and 12B are schematic views showing examples of different types of vacuum chamber configurations.
Figure 12B:
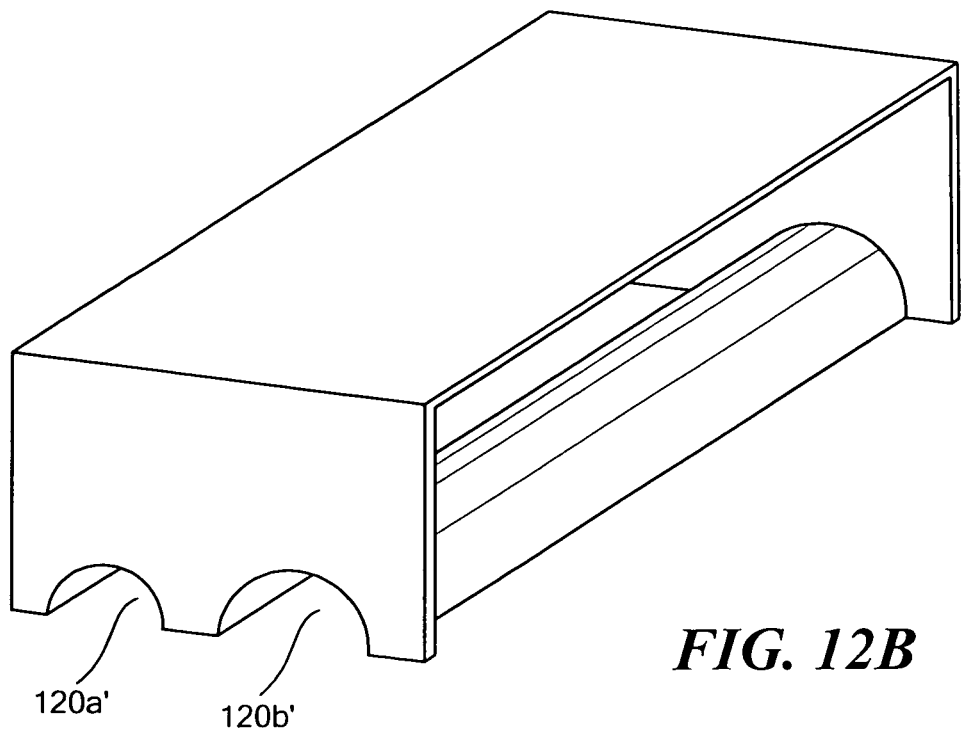

FIG. 12A shows a portion of a vacuum chamber with three non-magnetic vacuum barrier sleeves such as tunnels 120a, 120b, and 120c for the three screw shafts of FIG. 9. FIG. 12B shows an embodiment where two tunnels 120a' and 120b' are not full tubes.

Figure 13:
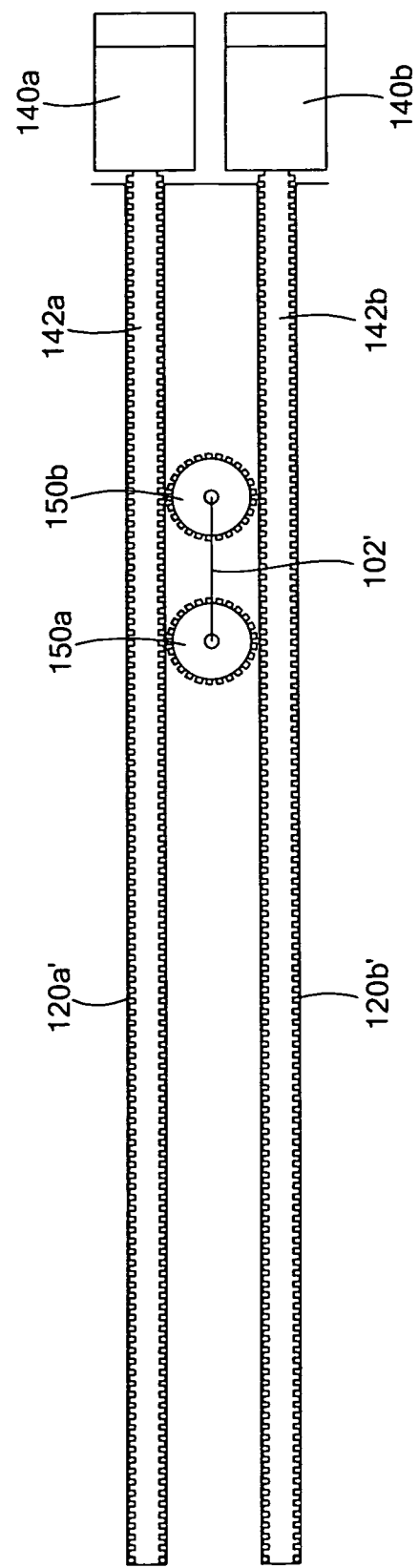
FIG. 13 is a schematic top view showing another example of a substrate transport system.

FIG. 13 shows a design where motors 140a and 140b rotate magnetic screw shafts 142a and 142b, respectively, in vacuum chamber tunnels 120a and 120b (see FIG. 10), respectively. Frame 102' within the vacuum chamber supports one or more arms (see FIG. 9) or serves as a wafer cart (see FIG. 3). Magnetic arrays, formed as gears or wheels 150a and 150b are coupled to frame 102' and magnetically interact with shafts 142a and 142b to rotate and linearly drive frame 102'. See also FIG. 14.

This contactless worm drive mechanism may be utilized to transmit rotary motion, and typically provide speed reduction, from one component to another component with rotational axes at 90 degrees to each other without the negative aspects of mechanical contact, such as the presence of friction, the need for lubrication, generation of particles and sensitivity to aggressive environments, associated with conventional worm drives. Therefore, due to its cleanliness of operation, the present contactless worm drive mechanism of one or more embodiments of this invention may be suitable for clean and vacuum applications and, due to its resistance to aggressive agents, also for harsh environments where conventional solutions fail. As an example application, the present contactless worm drive mechanism may be utilized in a material transport system, for instance, to actuate a material transport platform and its components.

Figure 14:
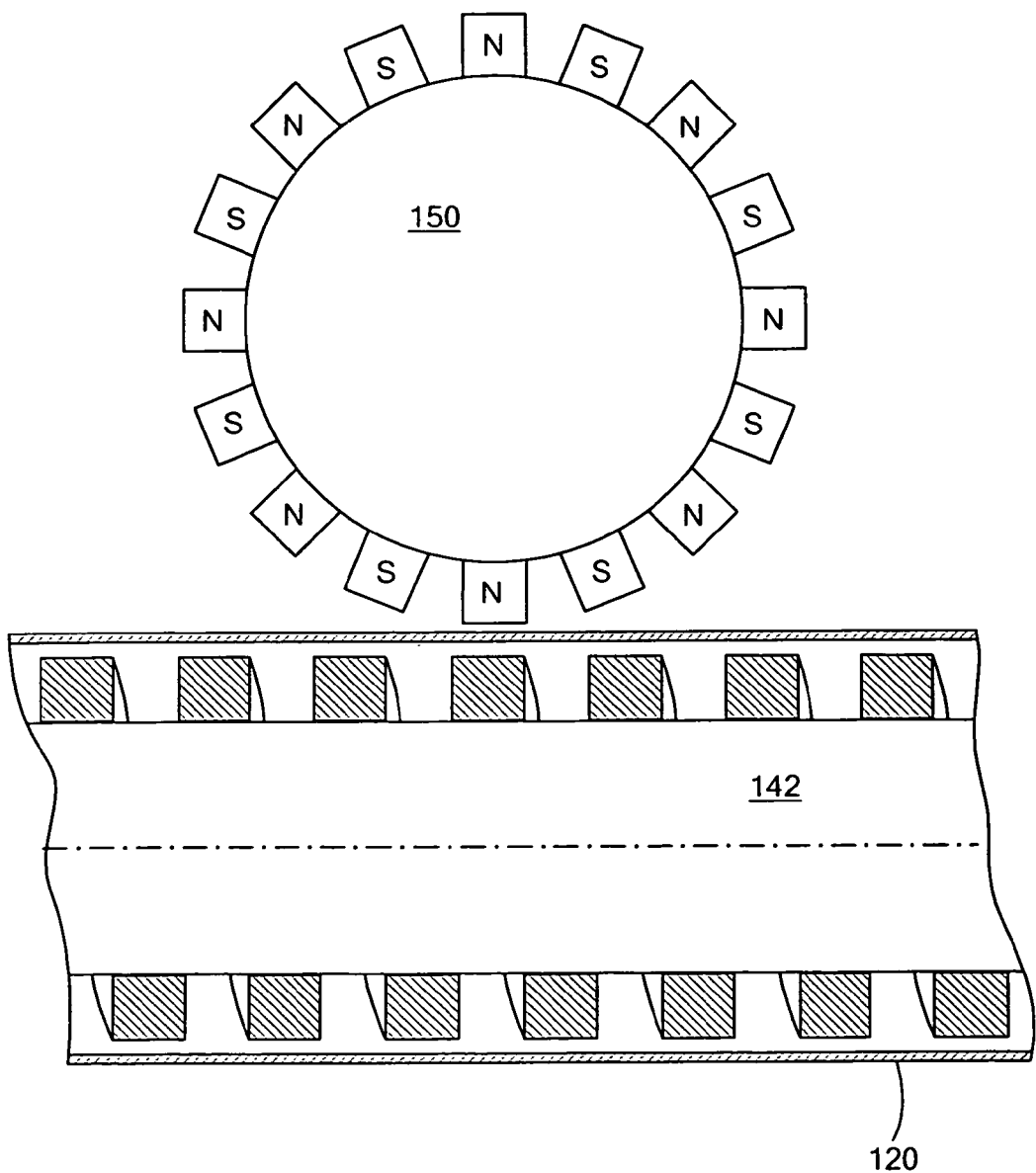
FIG. 14 is a schematic cross sectional view showing an example of a magnetic array fashioned as a wheel in accordance with the example of FIG. 13.

As shown in FIG. 14, the contactless worm drive mechanism of one or more embodiments of this invention may include a worm component 142 and one or more warm wheel components 150. The worm component may include a body of a substantially cylindrical shape and thread-type features on the cylindrical body made of a ferromagnetic material. The thread-type feature may be made of a solid piece, assembled from multiple pieces, laminated from multiple sheets to reduce eddy current losses, formed from metal powder or produced in any other suitable manner. The worm component may be constrained so that it is allowed to rotate with respect to the axis of its cylindrical body, for instance, by utilizing one or more rotary bearings, with respect to the worm wheel component(s). Each worm wheel component may include a substantially cylindrical body, which may feature tooth-type arrangements made of a ferromagnetic material and may be geometrically compatible with the thread-type features on the worm component. The tooth-type arrangements may be made of a solid piece, assembled from multiple pieces, laminated from multiple sheets to reduce eddy current losses, or produced in any other suitable manner. Each worm wheel component may also feature one or more magnets located so that a magnetic circuit is closed through the tooth-type arrangements of the worm wheel component and the thread-type features of the worm component. The magnets may be permanent magnets, electrically activated magnets or other magnets of any suitable type. In an alternative embodiment of this invention, the magnet(s) of the worm wheel component may interact directly with the thread-type features of the worm component. In yet another embodiment, the magnet(s) may be incorporated into the worm component. Each worm wheel component may be constrained so that it is allowed to rotate with respect to an axis perpendicular to the axis of the cylindrical body of the worm component, for instance, by utilizing one or more rotary bearings, with respect to the worm component. A separation wall made of a non-ferromagnetic material, which may, for example, be of a cylindrical shape, may be present between the worm component and the worm wheel component(s).

When the worm screw component is caused to rotate, the magnetic field produced by the magnets results in magnetic forces between the thread-type features of the worm component and the tooth-type arrangements of the worm wheel component(s), causing the worm wheel component(s) to rotate, typically at a reduced speed, allowing for higher torque. The separation wall 120 between the worm component and the worm wheel component(s) may be utilized to separate the environment where the worm component is located from the environment of the worm wheel component(s). For example, the worm component may be in atmosphere and the worm wheel component(s) in vacuum.

Numerous industrial applications, including transportation and positioning systems, may require a platform that can move along a straight-line path while carrying an actively driven mechanism, such as a robotic arm. The moveable platform 102', FIGS. 15A and 15B may provide this functionality with no on-board active components, such as power management solutions, control electronics and actuation arrangements. As a result, the moveable platform may be suitable for applications where the presence of active components on the moveable platform is undesirable, for instance, due to issues with heat removal, such as in vacuum environments.

The moveable platform may include of a body, which may be constrained to move along a straight-line path, for example, by utilizing one or more linear bearings or a magnetic levitation system. One or more magnetic worm wheel components 150a and 150b may be pivotably coupled to the body. One or more worm components may be arranged along the direction of motion of the body, for example, on the side of the body, below the body, above the body or in any suitable manner, so that the axes of rotation of the worm components are substantially parallel with the direction of motion of the body. Each of the worm components may interact with one or more worm wheel components through magnetic forces, forming one or more contactless worm drives. Separation walls made of a non-ferromagnetic material may be present between the worm wheel component(s) and the worm component(s).

Figure 15A:
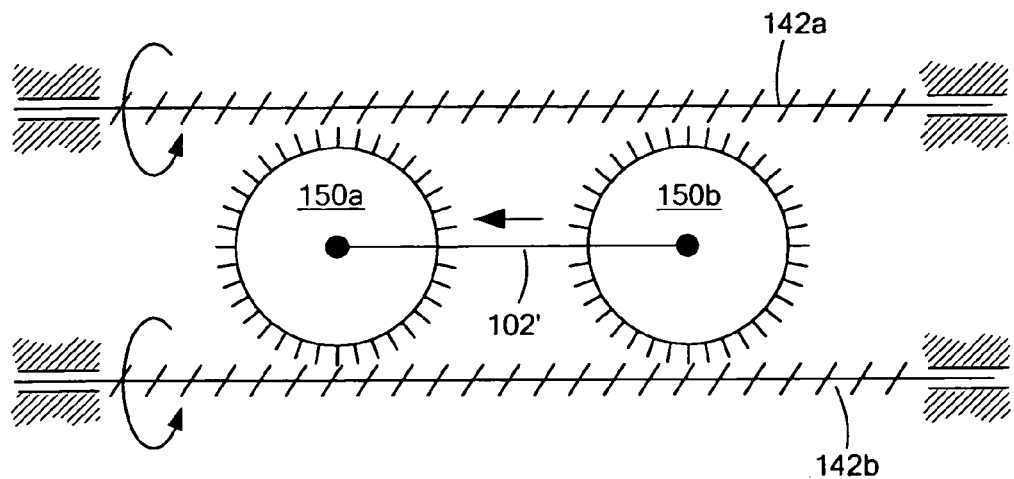
FIGS. 15A and 15B are schematic top views showing the operation of the system of FIGS. 13 and 14.

As shown in FIG. 15, an exemplary embodiment of a moveable platform according to one embodiment of this invention may include a body with a single worm wheel component and two worm components interacting with the worm wheel component on the opposite sides of the worm wheel component. When the worm components are caused to rotate in the same direction, FIG. 15A the worm wheel component does not rotate and translates along the direction of motion of the body of the platform, moving the body of the platform in the desired direction of motion. If the direction of rotation of both worm components is reversed, the body reverses the direction of motion as well.

Figure 15B:
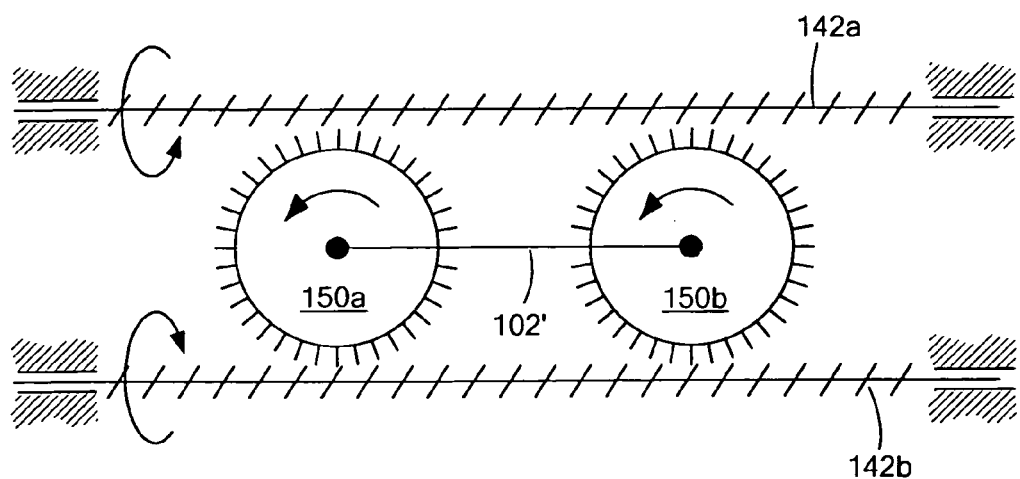

When the worm components rotate in opposite directions with respect to each other, FIG. 15B the center of the worm wheel component and, therefore, the body remain stationary while the worm wheel component rotates with respect to the body. If the direction of motion of each of the worm components is reversed, the rotation of the worm wheel component also reverses. Any combination of translation and rotation of the worm wheel component may be achieved by properly coordinated rotation of the two worm components.

The above described arrangement may be utilized to realize a moveable platform that may carry a robotic arm driven by the worm wheel component. When the worm components rotate in the same direction, the entire platform translates with no motion of the robotic arm with respect to the body of the platform. The worm components may be driven to rotate in the opposite directions to operate the robotic arm while the body of the platform remains stationary. The arm may be operated simultaneously while the body of the platform moves by properly coordinated rotation of the two worm components. Separation walls between the worm wheel component and the two worm components may be utilized to separate the environment(s) where the body and robotic arm operate and where the worm components are located. For example, since the body and robotic arm are completely passive, they may be located in a vacuum environment while the driven worm components may conveniently stay in atmosphere. Additional degrees of freedom of the robotic arm may be realized by employing additional worm drives.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A transport system comprising:
in a first environment, a driving screw having threads, the threads having a thread pitch and a second and third driving screw having second and third threads respectively; and
in a second environment a driven member having a magnetic coupling, the magnetic coupling having a driven member pitch substantially corresponding to the thread pitch, the driven member further comprising a substrate support and a second and third magnetic coupling magnetically coupled to at least a portion of the second and third threads respectively;
wherein, the magnetic coupling is magnetically coupled to at least a portion of the threads and wherein rotation of the driving screw displaces the magnetic coupling with respect to the driving screw; and
wherein, rotation of the first driving screw displaces the substrate support in a first direction and wherein rotation of the second driving screw displaces the substrate support in a second direction and wherein rotation of the third driving screw displaces the substrate support in a third direction.

2. The transport system of claim 1, wherein the driven member comprises a nut substantially surrounding at least a portion of the driving screw.

3. The transport system of claim 1, wherein the driven member comprises a gear.

4. The transport system of claim 1, wherein the driven member has a support bearing movably coupled to a sleeve, the sleeve disposed between the driving screw and the driven member.

5. The transport system of claim 1, wherein the driven member comprises magnets.

6. A substrate transport system comprising:
a non magnetic barrier sleeve isolating a first environment from a vacuum environment;
a driving screw having threads, the threads having a thread pitch and located within the first environment and a second and third driving screw having second and third threads respectively; and
a driven member located within the vacuum environment, the driven member operably coupled to a substrate support, the driven member having a magnetic coupling, the magnetic coupling having a driven member pitch substantially corresponding to the thread pitch, driven member further comprising a second and third magnetic coupling magnetically coupled to at least a portion of the second and third threads respectively;
wherein, the magnetic coupling is magnetically coupled to at least a portion of the threads and wherein rotation of the driving screw displaces the magnetic coupling with respect to the driving screw displacing the substrate support, and;
wherein, rotation of the driving screw displaces the substrate support in a first direction and wherein rotation of the second driving screw displaces the substrate support in a second direction and wherein rotation of the third driving screw displaces the substrate support in a third direction.

7. The transport system of claim 6, wherein the driven member comprises a nut substantially surrounding at least a portion of the driving screw.

8. The transport system of claim 6, wherein the driven member comprises a gear.

9. The transport system of claim 6, wherein the driven member has a support bearing movably coupled to the sleeve, the sleeve disposed between the driving screw and the driven member.

10. The transport system of claim 6, wherein the driven member comprises magnets.

11. A substrate transport system comprising:
first and second non magnetic barrier sleeves isolating a vacuum environment;
first and second driving screws having threads located within the first and second non magnetic barrier sleeves respectively outside of the vacuum environment, the first driving screw having first threads, the second driving screw having second threads;
a driven member located within the vacuum environment, the driven member operably coupled to a substrate support, the driven member having a first magnetic coupling magnetically coupled to the first threads, the driven member having a second magnetic coupling magnetically coupled to the second threads and a third driving screw having third threads, the driven member farther comprising a third magnetic coupling magnetically coupled to at least a portion of the third threads;
wherein, rotation of the first driving screw displaces the substrate support in a first direction and wherein rotation of the second driving screw displaces the substrate support in a second direction; and
wherein, rotation of the third driving screw displaces the substrate support in a third direction.

12. The transport system of claim 11, wherein the first magnetic coupling comprises a nut substantially surrounding at least a portion of the first driving screw.

13. The transport system of claim 11, wherein the first magnetic coupling comprises a gear.

14. The transport system of claim 11, wherein the driven member has a support bearing movably coupled to the first and second sleeves.

15. The transport system of claim 11, wherein the driven member comprises magnets.

* * * * *